(12) United States Patent
Song et al.

(10) Patent No.: US 11,604,417 B2
(45) Date of Patent: Mar. 14, 2023

(54) METHOD FOR DETECTING FLARE DEGREE OF LENS OF EXPOSURE MACHINE

(71) Applicant: Shanghai Huali Microelectronics Corporation, Shanghai (CN)

(72) Inventors: Haisheng Song, Shanghai (CN); Xiaolong Wang, Shanghai (CN); Shijun Zhou, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 17/492,786

(22) Filed: Oct. 4, 2021

(65) Prior Publication Data
US 2022/0121108 A1 Apr. 21, 2022

(30) Foreign Application Priority Data
Oct. 20, 2020 (CN) .......................... 202011125663.8

(51) Int. Cl.
*G03F 7/20* (2006.01)
*G03F 1/44* (2012.01)

(52) U.S. Cl.
CPC ............ *G03F 7/70591* (2013.01); *G03F 1/44* (2013.01); *G03F 7/7085* (2013.01); *G03F 7/70616* (2013.01); *G03F 7/70941* (2013.01)

(58) Field of Classification Search
CPC ............... G03F 7/70591; G03F 7/7085; G03F 7/70941; G03F 7/70908; G03F 7/7095;
(Continued)

(56) References Cited

U.S. PATENT DOCUMENTS

2005/0052651 A1* 3/2005 Kim ................... G03F 7/70941
356/433
2005/0083518 A1* 4/2005 Ki ....................... G03F 7/70941
356/124
(Continued)

FOREIGN PATENT DOCUMENTS

CN 111736435 A * 10/2020

OTHER PUBLICATIONS

English translation of CN111736435, published Oct. 2, 2020. (Year: 2020).*

*Primary Examiner* — Christina A Riddle
(74) *Attorney, Agent, or Firm* — Banner & Witcoff, Ltd.

(57) ABSTRACT

Provided in the disclosure is a photomask for detecting flare degree of lens of exposure machine. The photomask includes a central exposure area and a peripheral area, exposure light of the exposure machine passing through the lens and then penetrating the central exposure area to expose photoresist on a wafer, wherein the entire central exposure area is provided with a shading layer to prevent the exposure light from penetrating; and the peripheral area is provided with a plurality of light-transmitting stripes, and stray light formed after the exposure light passes through the lens penetrates the plurality of light-transmitting stripes to expose the photoresist. Further provided in the disclosure is a method for detecting flare degree of lens of exposure machine by using the photomask. According to the disclosure, a lens flare problem of an exposure machine can be found and solved in time.

10 Claims, 4 Drawing Sheets

(58) Field of Classification Search
CPC ............. G03F 7/70958; G03F 7/70975; G03F 7/70283; G03F 7/70483–70541; G03F 7/7055; G03F 7/70558; G03F 7/70583; G03F 7/706; G03F 7/70608; G03F 7/70616–70683; G03F 1/44; G03F 1/84; G03F 1/38; G03F 1/54; G03F 1/58; G03F 1/42; G03F 1/68; G03F 1/82
USPC ......... 355/18, 30, 52–55, 67–77, 133; 430/5
See application file for complete search history.

(56) References Cited

U.S. PATENT DOCUMENTS

| | | | |
|---|---|---|---|
| 2005/0095510 A1* | 5/2005 | Yamamoto | G03F 1/44 430/30 |
| 2005/0170264 A1* | 8/2005 | Hukuhara | G03F 7/70625 430/30 |
| 2005/0244724 A1* | 11/2005 | Asano | G03F 7/70675 430/30 |
| 2010/0225890 A1* | 9/2010 | Nagai | G03F 7/70591 356/229 |
| 2013/0063707 A1* | 3/2013 | Abu | G03F 7/70941 355/53 |

* cited by examiner

METHOD FOR DETECTING FLARE DEGREE OF LENS OF EXPOSURE MACHINE

CROSS-REFERENCES TO RELATED APPLICATIONS

This application claims priority to Chinese patent application No. 202011125663.8, filed on Oct. 20, 2020, the disclosure of which is incorporated herein by reference in its entirety.

TECHNICAL FIELD

The present invention relates to the field of semiconductors, in particular to detection of the flare degree of a lens of an exposure machine used in a semiconductor device photolithography process.

BACKGROUND

Photolithography means photo—litho—riting literally in Greek. Photolithography is a pattern transfer technology for transferring a pattern, on a mask, to a silicon wafer coated with photoresist and removing a specific part of a thin film on the surface of the silicon wafer by means of a series of production steps. Photolithography technology is a semiconductor key process technology developed on the basis of photographing technology and planographic printing technology.

Light emitted by a light source irradiates the mask, and the emitted light already carries pattern information of the mask. According to the mask, a pattern structure needing to be manufactured is drawn on a transparent substrate (quartz), a pattern area needing to be penetrated by the light is kept transparent, and a shading layer is arranged in a non-pattern area not needing to be penetrated by the light. The light carrying mask pattern information irradiates on the substrate spin-coated with the photosensitive material (photoresist), and this process is called exposure. The property of the irradiated photoresist is different from that of the non-irradiated photoresist, so as to differently process the photoresist in a subsequent developing process, that is, a photosensitive area of the positive photoresist and a non-photosensitive area of the negative photoresist are dissolved in developer and be removed, and a non-photosensitive area pattern of the positive photoresist and a photosensitive area pattern of the negative photoresist are reserved. By means of exposure and development, the pattern on the mask is transferred to the photoresist, and then the pattern on the photoresist is transferred to the substrate by means of subsequent etching or thin-film deposition and other processes.

Exposure is a key step in the photolithography process. In the prior art, a most major method for optical exposure of a silicon wafer is projection type exposure, an image on a mask is reduced by 4 or 5 times by an optical system generally, exposure is performed after focusing and alignment with an existing pattern on the silicon wafer, a small part is exposed each time, and after one pattern is exposed, the silicon wafer is moved to the next exposure position for continuous alignment and exposure.

The main structure of an exposure machine of a projection-type exposure photolithography machine will be understood in conjunction with FIG. 1. The exposure machine mainly includes an aperture shutter 100, a relay lens 200, a photomask 300 and a projection lens 400. The aperture shutter defines an exposure area of the photomask, that is, a central exposure area 310 of the photomask 300 in FIG. 1. In a conventional exposure process, exposure light 610 penetrates the aperture shutter 100, passes through the relay lens 200, then penetrates the central exposure area 310 and passes through the projection lens 400 to be focused on the surface of the wafer 500, so as to transfer a pattern of the central exposure area 310 of the photomask to photoresist on the surface of the wafer.

Then, as the use time of the photolithography machine increases, the lenses of the exposure system become blurred, and the exposure rays form stray light after passing through the relay lens 200 or the projection lens 400, that is, a lens flare. The formed stray light influences the uniformity of a light source in a normal exposure process, which generates unnecessary feature size difference and reduces the analytical capability of the photolithography machine, thereby influencing a process window.

FIG. 1 shows the influence of the lens flare on normal exposure together. It can be known from FIG. 1 that the normal exposure light 610 generates the stray light 620 diverging in all directions after passing through the relay lens 200 where the lens flare occurs, and the stray light 620 can penetrate the photomask from all angles, thereby generating unnecessary exposure light, which interferes in the light intensity distribution of the normal exposure light is in the exposure process.

Therefore, there is a need to monitor whether a lens of an exposure system has flare. In the prior art, the lens flare is monitored by using an extreme light source with a complex process, which results in low frequency of lens flare monitoring, typically a monthly or quarterly inspection. Lens flare cannot be found under lens flare monitoring with low frequency in time, and timeliness is poor.

Therefore, a method for detecting the flare degree of the lens of the exposure machine is urgently needed for conveniently monitoring the lens flare, then the frequency of lens flare monitoring can be improved, and the lens flare problem can be found in time and then solved.

BRIEF SUMMARY

The following presents a simplified summary of one or more aspects in order to provide a basic understanding of such aspects. This summary is not an extensive overview of all conceivable aspects and is not intended to identify key or critical elements of all aspects or delimit the scope of any or all aspects. The sole purpose is to present some concepts of one or more aspects in a simplified form as a prelude to the more detailed description that will be presented later.

As described above, for solving the problems that in the prior art, a process of lens flare monitoring is complex, the monitoring frequency is low, and the lens flare may not be found in time, on one aspect, the present invention provides a photomask for detecting flare degree of lens of exposure machine, and a conventional exposure process may be employed to monitor the lens flare by means of the photomask, thereby improving the frequency of lens flare monitoring, and the lens flare problem may be found and solved in time.

Specifically, the photomask includes a central exposure area which is unblocked by an aperture shutter and a peripheral area which is blocked by the aperture shutter, and exposure light of the exposure machine sequentially passes through the aperture shutter and the lens and then penetrates the central exposure area to expose photoresist on a wafer, wherein the entire central exposure area is provided with a shading layer to prevent the exposure light from penetrating; and the peripheral area is provided with a plurality of light-transmitting stripes, and stray light formed after the exposure light passes through the lens penetrates the plurality of light-transmitting stripes to expose the photoresist.

In one embodiment of the photomask, optionally, the peripheral area is provided with a patterned shading layer, and a portion, with no shading layer arranged, of the peripheral area forms the plurality of light-transmitting stripes.

In one embodiment of the photomask, optionally, the shading layer is a chromium layer.

In one embodiment of the photomask, optionally, the central exposure area is rectangular, and the plurality of light-transmitting stripes are located on the edges of a plurality of concentric rectangles which surround the central exposure area, are concentric with the central exposure area and are geometrically similar to the central exposure area in shape.

In one embodiment of the photomask, optionally, the central exposure area is rectangular, and the plurality of light-transmitting stripes form a plurality of concentric rectangles which surround the central exposure area, are concentric with the central exposure area and are geometrically similar to the central exposure area in shape.

In another aspect, the present invention further provides a method for detecting the flare degree of a lens of an exposure machine, specifically, the method includes:

providing a test wafer, the surface of the test wafer being coated with photoresist;

exposing the photoresist on the surface of the test wafer by using the photomask as described in any embodiment, so as to make only the stray light formed after the exposure light of the exposure machine passes through the lens penetrate the photomask to reach the photoresist;

developing the photoresist after exposure; and detecting a developed photoresist pattern to determine the flare degree of the lens.

In one embodiment of the method, optionally, determining the flare degree of the lens further includes:

in response to a condition that the surface of the test wafer is provided with no photoresist pattern after development, determining that the lens has no flare.

In one embodiment of the method, optionally, determining the flare degree of the lens further includes:

in response to a condition that the surface of the test wafer is provided with a striped photoresist pattern after development, determining the flare degree of the lens according to the number of stripes of the photoresist pattern, wherein the more the stripes are, the higher the flare degree is.

In one embodiment of the method, optionally, determining the flare degree of the lens further includes:

in response to a condition that the surface of the test wafer is provided with a striped photoresist pattern after development, determining the flare degree of the lens according to the critical dimension of a stripe of the photoresist pattern, wherein the larger the critical dimension of the stripe is, the higher the flare degree is.

In one embodiment of the method, optionally, the central exposure area of the photomask is rectangular, and the plurality of light-transmitting stripes in the peripheral area of the photomask form a plurality of concentric rectangles which surround the central exposure area, are concentric with the central exposure area and are geometrically similar to the central exposure area in shape; wherein determining the flare degree of the lens according to the critical dimension of a stripe of the photoresist pattern further includes:

determining the flare degree of the lens according to the critical dimension of an innermost stripe in the photoresist pattern only, the innermost stripe being a photoresist pattern formed on an area closest to a test wafer area corresponding to the central exposure area.

In one embodiment of the method, optionally, the method further includes:

obtaining a functional relation between the critical dimension of the innermost stripe and the flare degree in advance; wherein determining the flare degree of the lens according to the critical dimension of a stripe of the photoresist pattern further includes:

obtaining the quantified flare degree on the basis of the detected critical dimension of the innermost stripe and the functional relation.

According to the photomask provided in one aspect of the present invention, the entire central exposure area is provided with the shading layer, so as to prevent normal exposure light from penetrating, and the normal exposure light does not expose the photoresist. By arranging the light-transmitting stripes in the peripheral area, under the condition of lens flare, only the generated stray light penetrates into the photoresist to expose the photoresist. Therefore, in another aspect, the present invention further provides the method for detecting the flare degree of the lens of the exposure machine, the photomask provided by one aspect of the present invention is employed in the conventional exposure process flow, the photomask only allows the stray light generated after the normal exposure light passes through the lens to penetrate so as to expose the photoresist, and accordingly, by observing whether a photoresist pattern is left on the test wafer after development, whether the lens of the exposure machine has the flare may be detected. Meanwhile, the flare degree of the lens of the exposure machine may be detected by analyzing the developed photoresist pattern. According to the photomask and the method for detecting the flare degree of the lens of the exposure machine, a process of lens flare detection is compatible with the conventional exposure process flow, the operation is simple, and lens flare monitoring may be facilitated, thereby improving the maintenance convenience of the lens, and finding and solving the lens flare problem in time.

BRIEF DESCRIPTION OF THE DRAWINGS

The foregoing features and advantages of the present invention can be better understood upon reading the detailed description of embodiments of the present disclosure in conjunction with the following drawings. In the drawings, the components are not necessarily drawn to scale, and components having similar related characteristics or features may have the same or similar reference numbers.

REFERENCE NUMBERS

Figure 1:
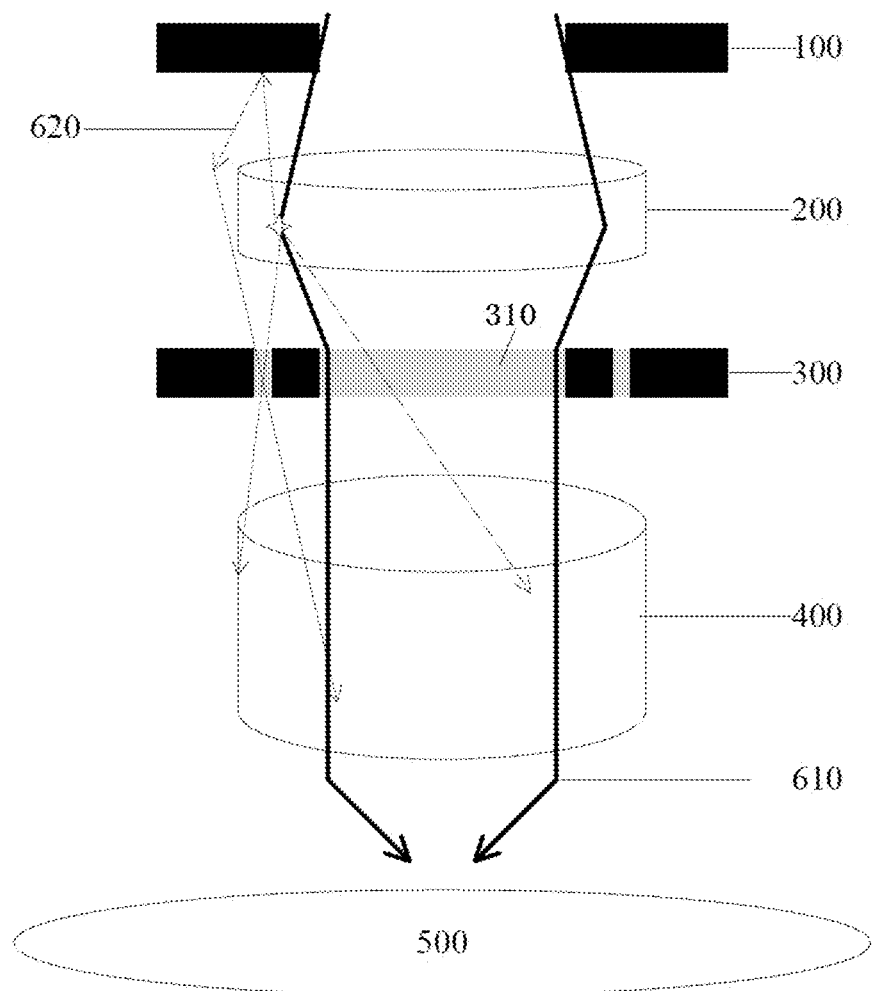
FIG. 1 shows the main structure of an exposure machine of a projection-type exposure photolithography machine.

100 Aperture shutter
200 Relay lens
300 Photomask
310 Central exposure area
400 Projection lens
500 Wafer
610 Exposure light
620 Stray light
700 Photomask
710 Central exposure area
720 Peripheral area
721 Light-transmitting stripe
800 Test wafer
810 Central dark area
820 Monitoring area

DETAILED DESCRIPTION OF THE DISCLOSURE

The present invention will be described in detail in conjunction with the accompanying drawings and the specific embodiments. It should be noted that the aspects described below in conjunction with the accompanying drawings and the specific embodiments are merely illustratively and should not be construed as limiting the scope of protection of the present invention.

The present invention relates to the field of semiconductors, in particular to detection of the flare degree of a lens of an exposure machine used in a semiconductor device photolithography process. The method for detecting the flare degree of the lens of the exposure machine, provided in one aspect of the present invention, employs a photomask provided in another aspect of the present invention to expose photoresist on the upper surface of a test wafer, only stray light formed after exposure light passes through the lens reaches the photoresist on the upper surface of the test wafer, and accordingly, whether the lens flare exists and the flare degree may be determined by observing the photoresist pattern after the photoresist is developed. According to the photomask and the method for detecting the lens flare of the exposure machine by using the photomask, provided by the present invention, the lens flare detection may be achieved by using parameters compatible with a conventional exposure process, the detection difficulty is reduced, and the detection cost is saved, thereby improving the detection frequency, and finding and solving the lens flare problem in time.

The following description is provided to enable those skilled in the art to implement and use the present invention and incorporate it into a specific application background. Various modifications, as well as various uses in different applications, will be readily apparent to those skilled in the art, and the general principles defined herein may be applied to embodiments in a broader range. Thus, the present invention is not limited to the embodiments presented herein but is to encompass the broadest scope consistent with the principles and novelty features disclosed herein.

In the following detailed description, numerous specific details are set forth in order to provide a more thorough understanding of the present invention. However, it will be apparent to those skilled in the art that the practice of the present invention may not be limited to these specific details. In other words, well-known structures and devices are shown in block diagram forms without detail in order to avoid obscuring the present invention.

A reader may note that all documents and literature which are filed concurrently with this specification and which are open to public inspection to this specification and the contents of all such documents and literature are incorporated herein by reference. All features disclosed in this specification (including any appended claims, abstract and drawings) may be replaced with alternative features serving the same, equivalent or similar purpose, unless otherwise indicated directly. Thus, unless otherwise stated expressly, each feature disclosed is only one example of a set of equivalent or similar features.

It is to be noted that, where used, the signs left, right, front, back, top, bottom, forward, reverse, clockwise, and counterclockwise are used merely for the purpose of convenience and do not imply any particular fixed orientation. In fact, they are used to reflect a relative position and/or orientation between various parts of an object.

The terms, "over", "under", "between", and "on" used herein refer to the relative position of this layer with respect to other layers. Likewise, for example, one layer deposited or placed over or under another layer may make direct contact with another layer or may have one or more intermediate layers. Further, a layer deposited or placed between layers may make direct contact with these layers, or may have one or more intermediate layers. In contrast, a first layer "on" a second layer makes contact with the second layer. Further, the relative position of one layer with respect to other layers is provided (assuming deposition, modification, and removal operations of a thin film with respect to an initial substrate irrespective of the absolute orientation of the substrate).

For solving the problems that in the prior art, a process of lens flare monitoring is complex, that the monitoring frequency is low, and that the lens flare may not be found in time, in one aspect, the present invention provides a photomask for detecting the flare degree of a lens of an exposure machine, and a conventional exposure process may be employed to monitor the lens flare by means of the photomask, thereby improving the frequency of lens flare monitoring, and the lens flare problem may be found and solved in time.

Figure 2:
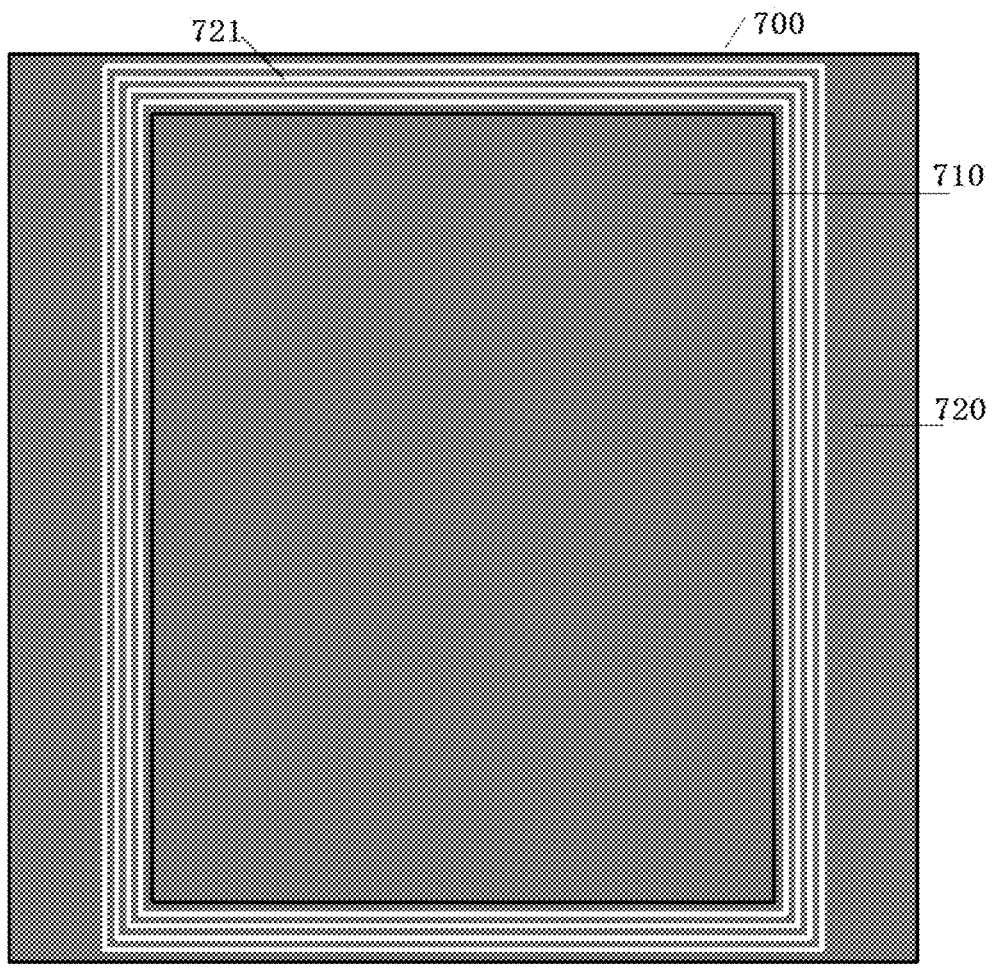
FIG. 2 shows a schematic diagram of a photomask provided in one aspect of the present invention.

Firstly, the photomask provided in one aspect of the present invention may be understood with reference to FIG. 2. According to the operation principle of the exposure machine of the projection-type exposure photolithography machine above, the photomask 700 is divided into a central exposure area 710 and a peripheral area 720 due to the presence of an aperture shutter. The central exposure area 710 is an area which is unshielded by the aperture shutter and through which exposure light may pass, and the peripheral area 720 is an area which is shielded by the aperture shutter and through which normal exposure light may not pass normally.

In the photomask 700 provided by the present invention, the entire central exposure area 710 is provided with a shading layer. The entire central exposure area 710 is provided with the shading layer, and accordingly, the exposure light may not actually penetrate the photomask 700 provided by the present invention to reach photoresist on the upper surface of a test wafer. Under the condition that the lens of the exposure machine has no flare, if the photomask 700 provided by the present invention is used for exposure, the photoresist on the upper surface of the test wafer should not be exposed, and no photoresist pattern is left on the upper surface of the test wafer after development.

In the embodiments described above, a substrate of the entire central exposure area 710 may be coated with a chromium metal layer to form the shading layer described above. It is to be noted that those skilled in the art may employ existing or later means to achieve the arrangement of the shading layer, and the above embodiment employing the chromium metal layer to form the shading layer should not unduly limit the scope of protection of the present invention.

In the photomask 700 provided by the present invention, the peripheral area 720 is provided with a plurality of light-transmitting stripes 721. Specifically, a patterned shading layer may be provided in the peripheral area, so that a light-transmitting area may be naturally formed in an area where the shading layer is not provided.

In the above embodiment, as for the patterned shading layer, a layer of chromium metal (lightproof) may be covered on fused quartz (that is, the substrate of the photomask), a laser beam or an electron beam moves on the surface according to a defined pattern for exposure, then chromium in the exposed area is etched away, the area with the chromium metal reserved is the shading layer, the area with the chromium etched and removed is a light-transmitting area, light may pass through the light-transmitting area to expose the photoresist. It is to be noted that those skilled in the art may employ existing or later means to achieve the arrangement of the patterned shading layer, the specific implementation mode of the patterned shading layer should not unduly limit the scope of protection of the present invention.

Under the condition that the lens of the exposure machine has the flare, stray light formed by exposure light penetrating the lens may penetrate the peripheral area 720, and under the condition that the light-transmitting stripe 721 is arranged in the peripheral area 720, the stray light may penetrate the light-transmitting stripe 721 to reach the photoresist on the upper surface of the test wafer so as to the expose the photoresist. The photoresist exposed by the stray light leaves a photoresist pattern after being developed, thereby representing the lens flare.

It may be appreciated that an existing common photomask is a 152*152 mm photomask, for a step-scan photolithography machine, each exposure is performed at the ratio of 4:1, and the exposure area is 26*33 mm, that is, the size of the central exposure area of the photomask 700 is 104*132 mm, and the light-transmitting stripe is formed in the peripheral area 720 outside the central exposure area 710.

In one embodiment, the plurality of light-transmitting stripes is located on the edges of a plurality of concentric rectangles which surround the central exposure area 710, are concentric with the central exposure area 710 and are geometrically similar to the central exposure area in shape.

In another embodiment, the plurality of light-transmitting stripes forms a plurality of concentric rectangles which surround the central exposure area 710, are concentric with the central exposure area 710 and are geometrically similar to the central exposure area in shape, as shown in FIG. 2

The above concentric rectangles not only mean that the geometric symmetry centers of the rectangles coincide, but also mean that the corresponding sides of the rectangles do not intersect.

It may be appreciated that light-transmitting patterns of other pattern shapes may also allow the stray light to penetrate in the presence of lens flare. In the above two embodiments, the light-transmitting patterns are arranged to be striped, and the plurality of light-transmitting stripes are arranged on the edges of the concentric rectangles or directly form the concentric rectangles, which may better quantify the flare degree of the lens during lens flare detection, and the flare degree detection is more rational and intuitive.

Besides, as for the number of the light-transmitting stripes, those skilled in the art may perform adaptive adjustment according to actual conditions, and the number of the light-transmitting stripes should not unduly limit the scope of protection of the present invention.

It may be appreciated that by means of the photomask provided in one aspect of the present invention, a lens flare detection flow may be achieved by means of the conventional exposure flow, an exposure light source used in the lens flare detection flow is an exposure light source used in the conventional process, no extreme light source is needed, and related exposure parameters are also compatible with related parameters in the conventional exposure flow, which will not increase extra process cost and complexity. The lens flare detection flow is compatible with the conventional exposure process flow, and the operation is simple, thereby facilitating lens flare monitoring.

Figure 3:
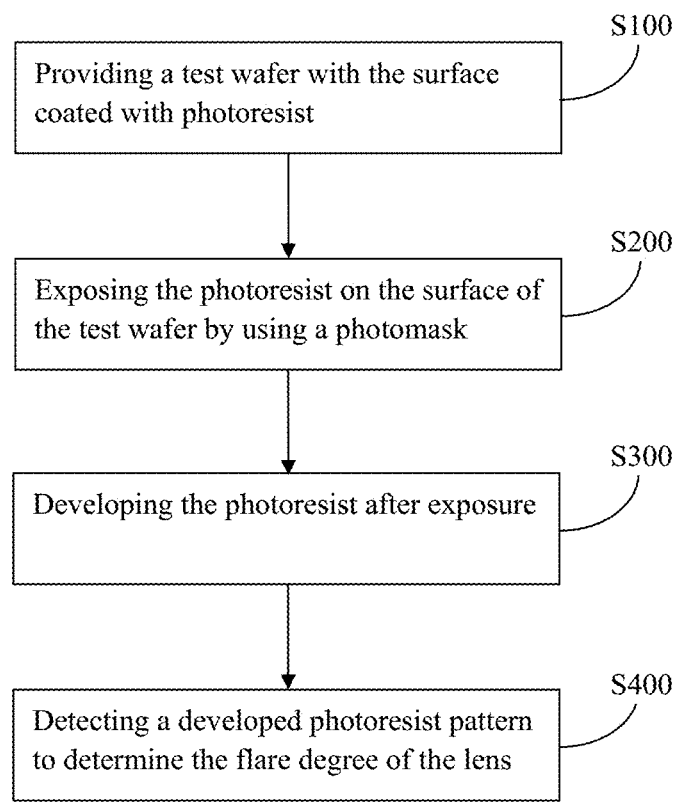
FIG. 3 shows a schematic flow diagram of a method for detecting the flare degree of a lens of an exposure machine, provided in another aspect of the present invention.

Further, in another aspect, the present invention further provides a method for detecting the flare degree of a lens of an exposure machine, and with reference to FIG. 3, FIG. 3 shows a flow diagram of the method for detecting the flare degree of the lens of the exposure machine, provided in another aspect of the present invention.

As shown in FIG. 3, the method for detecting the flare degree of the lens of the exposure machine, provided in another aspect of the present invention, includes S100: providing a test wafer with the surface coated with photoresist; S200: exposing the photoresist on the surface of the test wafer by using a photomask 700; S300: developing the photoresist after exposure; and S400: detecting a developed photoresist pattern to determine the flare degree of the lens.

In S100, it may be appreciated that the above test wafer may be various types of substrates compatible with a conventional process, for example, a pure silicon wafer, a doped silicon wafer, or a stack of various semiconductors. It is to be noted that the above test wafer only requires one base capable of coating photoresist, and that the type of particular test wafer should not unduly limit the scope of protection of the present invention.

The above photoresist may be various existing or later photoresist materials, for example, common positive photoresist, negative photoresist and other materials having different properties under photosensitive and non-photosensitive conditions.

In the method described above, the specific condition of the photomask 700 employed in S200 may refer to the above description with respect to the photomask, which will not be described in detail herein.

In S200, a related light source and related exposure parameters employed for exposure are compatible with the conventional exposure process, which does not increase the complexity and the detection cost of the detection process.

In S300, those skilled in the art may employ existing or later technologies to develop the photoresist, and the specific implementation mode of the developing process of the photoresist after exposure should not unduly limit the scope of protection of the present invention.

Figure 4:
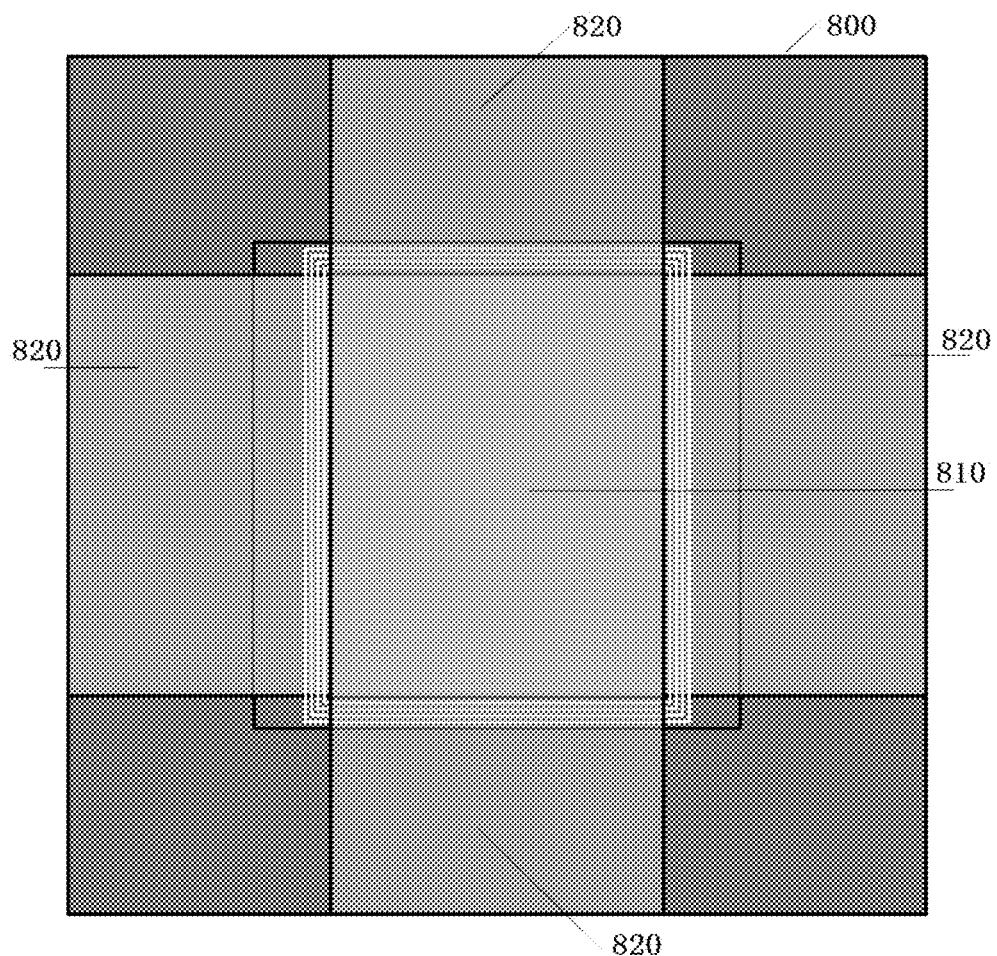
FIG. 4 shows a schematic diagram of developed photoresist observed on the upper surface of a test wafer.

S400 may be appreciated in conjunction with FIG. 4. FIG. 4 shows a schematic diagram of developed photoresist observed on the upper surface of a test wafer. Specifically, the surface of the test wafer 800 may have a central dark area 810 corresponding to the central exposure area. In a normal exposure flow, the pattern of the central exposure area of the photomask should be transferred to the central dark area 810 by exposure. However, the central exposure area 710 of the photomask 700 employed in S200 is completely provided with the shading layer, such that no photoresist pattern is left in the central dark area 810 of the test wafer 800 after S200.

In S400, whether the lens generates flare may be determined by monitoring whether photoresist patterns exist on four monitoring areas 820 of the test wafer 800. Specifically, if no photoresist pattern exists in the four monitoring areas 820 after development, it is determined that the lens has no flare.

If the photoresist patterns appear in the four monitoring areas 820 after development, it is determined that the lens has flare. Further, the severity of the lens flare may influence the light intensity of stray light, and then the photoresist pattern finally appearing on the test wafer may be influenced.

In one embodiment, the flare degree of the lens may be determined according to the number of the stripes of the photoresist pattern, and the more the stripes are, the higher the flare degree is and the more serious the flare is.

In another embodiment, the flare degree of the lens may further be determined according to the critical dimension of the stripe of the photoresist pattern, and the larger the critical dimension is, the higher the flare degree is.

The severity of the lens flare may influence the light intensity of the stray light, the light intensity of the stray light may influence the critical dimension of the developed photoresist pattern, and accordingly, the flare degree of the lens may be detected by monitoring the critical dimension of the stripe of the photoresist pattern.

Further, in the embodiment employing the photomask 700 shown in FIG. 2, that is, under the conditions that the central exposure area of the photomask is rectangular, and that the plurality of light-transmitting stripes in the peripheral area of the photomask form the plurality of concentric rectangles which surround the central exposure area, are concentric with the central exposure area and are geometrically similar to the central exposure area in shape, determining the flare degree of the lens according to the critical dimension of the stripe of the photoresist pattern further includes: determining the flare degree of the lens only according to the critical dimension of an innermost stripe in the photoresist pattern, the innermost stripe being a photoresist pattern formed on an area closest to a test wafer area corresponding to the central exposure area.

Because the flare degrees of different lenses may be compared transversely, direction, the flare degree of the lens is determined only according to the critical dimension of the innermost stripe in the photoresist pattern.

More preferably, the method provided by the present invention further includes: obtaining a functional relation between the critical dimension of the innermost stripe and the flare degree in advance. Then, determining the flare degree of the lens according to the critical dimension of the stripe of the photoresist pattern further includes: obtaining the quantified flare degree on the basis of the detected critical dimension of the innermost stripe and the functional relation.

Figure 5:
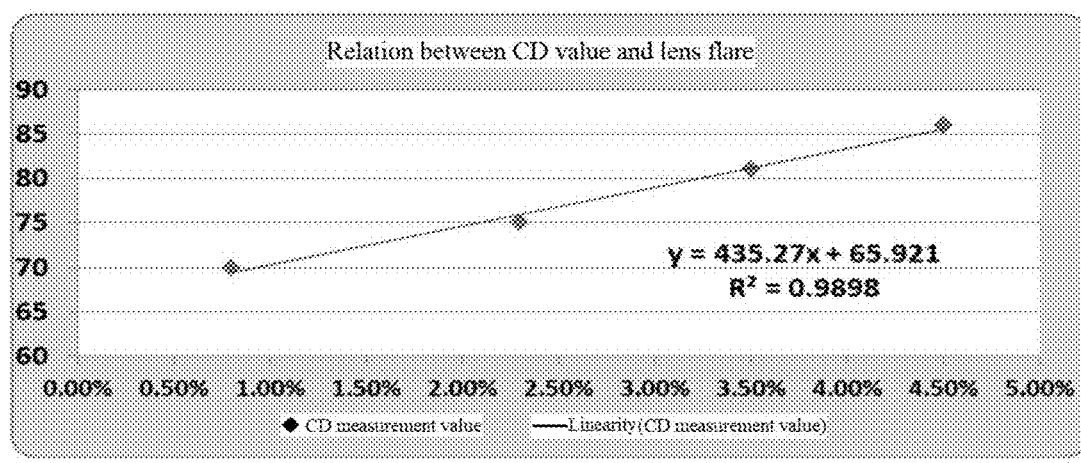
FIG. 5 shows a relation between the critical dimension of a striped photoresist pattern and the flare degree of the lens.

With further reference to FIG. 5, FIG. 5 shows a relation between the critical dimension (CD value), acquired in advance, of the innermost stripe and the flare degree of the lens, the abscissa axis represents the light transmittance of the lens, which may represent the flare degree, and the ordinate axis represents the critical dimension of the stripe.

It can be seen from FIG. 5 that the critical dimension of the stripe may represent the severity of the lens flare.

It may be appreciated that for obtaining a quantified flare degree of the lens, exposure parameters employed each time the lens flare is detected should be consistent with exposure parameters employed when the functional relation between the critical dimension of the stripe and the flare degree is obtained in advance. That is, an initial reference CD is adjusted by means of the exposure energy of the central area, and after the initial reference CD is determined, the identical exposure energy is kept to obtain the relation between the critical dimension (CD value) of the stripe and the flare degrees of various lenses in advance. Then, in each detection process, exposure is still carried out by using the exposure energy, and accordingly, the flare degree of the lens may be quantitatively reflected according to the CD value obtained by monitoring.

In this way, the specific embodiments of the photomask and the method for detecting the flare degree of the lens of the exposure machine have been described. According to the photomask provided in one aspect of the present invention, the entire central exposure area is provided with the shading layer, so as to prevent normal exposure light from penetrating, and the normal exposure light does not expose the photoresist. By arranging the light-transmitting stripes in the peripheral area, under the condition of lens flare, only the generated stray light penetrates into the photoresist to expose the photoresist. Therefore, according to the method for detecting the flare degree of the lens of the exposure machine, provided in another aspect of the present invention, the photomask provided by one aspect of the present invention is employed in the conventional exposure process flow, the photomask only allows the stray light generated after the normal exposure light passes through the lens to penetrate so as to expose the photoresist, and accordingly, by observing whether a photoresist pattern is left on the test wafer after development, whether the lens of the exposure machine has the flare may be detected. Meanwhile, the flare degree of the lens of the exposure machine may be detected by analyzing the developed photoresist pattern. According to the photomask and the method for detecting the flare degree of the lens of the exposure machine, a process of lens flare detection is compatible with the conventional exposure process flow, the operation is simple, and lens flare monitoring may be facilitated, thereby improving the maintenance convenience of the lens, and finding and solving the lens flare problem in time.

While the present disclosure has been described by means of specific exemplary embodiments, it will be apparent that various modifications and changes may be made to these embodiments without departing from the broader spirit and scope of the present disclosure. Accordingly, the specification and accompanying drawings should be deemed as an illustrative meaning rather than a restrictive meaning.

It should be appreciated that the specification is not to be used to interpret or limit the scope or meaning of the claims. In addition, in the foregoing detailed description, it can be seen that various features are combined together in a single embodiment for the purpose of simplifying the present disclosure. This method of the present disclosure should not be interpreted as reflecting an objective that the claimed embodiments require more features than those are expressly recited in each claim. On the contrary, as the appended claims reflect, an inventive subject matter lies in employing features less than all features of a single disclosed embodiment. Thus, the appended claims are hereby incorporated into the detailed description, with each claim standing on its own as a separate embodiment.

One embodiment, or a particular feature, structure, or characteristic described in conjunction with the embodiments, referred to in this description are included in at least one embodiment of a circuit or method. A phrase, one embodiment, appearing in various places in the specification do not necessarily all refer to the same embodiment.

What is claimed is:

1. A method for detecting a flare degree of a lens of an exposure machine, wherein the method comprises:
providing a photomask, the photomask comprising a central exposure are which is unblocked by an aperture shutter and a peripheral area which is blocked by the aperture shutter, wherein exposure light of the exposure machine sequentially passes through the aperture shutter and the lens and then penetrates the central exposure area to expose photoresist on a wafer, wherein an entirety of the central exposure area is provided with a shading layer to prevent the exposure light from penetrating, and the peripheral area is provided with a plurality of light-transmitting stripes, wherein stray light formed after the exposure light passes through the lens penetrates the plurality of light-transmitting stripes to expose the photoresist;
providing a test wafer, a surface of the test wafer being coated with photoresist;
exposing the photoresist on the surface of the test wafer by using the photomask as a mask, so as to make only stray light formed after exposure light of the exposure machine passes through the lens penetrate the photomask to reach the photoresist;
developing the photoresist after exposure; and
detecting a developed photoresist pattern to determine the flare degree of the lens.

2. The method of claim 1, wherein determining the flare degree of the lens further comprises:
in response to a condition that the surface of the test wafer is provided with no photoresist pattern after development, determining that the lens has no flare.

3. The method of claim 1, wherein determining the flare degree of the lens further comprises:
in response to a condition that the surface of the test wafer is provided with a striped photoresist pattern after development, determining the flare degree of the lens according to the number of stripes of the photoresist pattern, wherein
the more the stripes are, the higher the flare degree is.

4. The method of claim 1, wherein determining the flare degree of the lens further comprises:
in response to a condition that the surface of the test wafer is provided with a striped photoresist pattern after development, determining the flare degree of the lens according to a critical dimension of a stripe of the photoresist pattern, wherein
the larger the critical dimension of the stripe is, the higher the flare degree is.

5. The method of claim 4, wherein the central exposure area of the photomask is rectangular, and the plurality of light-transmitting stripes in the peripheral area of the photomask form a plurality of concentric rectangles which surround the central exposure area, are concentric with the central exposure area and are geometrically similar to the central exposure area in shape; wherein
determining the flare degree of the lens according to a critical dimension of a stripe of the photoresist pattern further comprises:
determining the flare degree of the lens only according to the critical dimension of an innermost stripe in the photoresist pattern, the innermost stripe being a photoresist pattern formed on an area closest to a test wafer area corresponding to the central exposure area.

6. The method of claim 5, further comprising:
obtaining a functional relation between the critical dimension of the innermost stripe and the flare degree in advance, wherein
determining the flare degree of the lens according to a critical dimension of a stripe of the photoresist pattern further comprises:
obtaining a quantified flare degree on the basis of the detected critical dimension of the innermost stripe and the functional relation.

7. The method of claim 1, wherein the peripheral area is provided with a patterned shading layer, and a portion, with no shading layer arranged, of the peripheral area forms the plurality of light-transmitting stripes.

8. The method of claim 1, wherein the shading layer is a chromium layer.

9. The method of claim 1, wherein the central exposure area is rectangular, and the plurality of light-transmitting stripes are located on edges of a plurality of concentric rectangles which surround the central exposure area, are concentric with the central exposure area, and are geometrically similar to the central exposure area in shape.

10. The method of claim 1, wherein the central exposure area is rectangular, and the plurality of light-transmitting stripes form a plurality of concentric rectangles which surround the central exposure area, are concentric with the central exposure area, and are geometrically similar to the central exposure area in shape.

* * * * *